(12) United States Patent
Cha (10) Patent No.: US 12,191,387 B2
(45) Date of Patent: Jan. 7, 2025

(54) HIGH VOLTAGE SEMICONDUCTOR DEVICE AND MANUFACTURING METHOD THEREOF

(71) Applicant: SK keyfoundry Inc., Cheongju-si (KR)

(72) Inventor: Hanseob Cha, Cheongju-si (KR)

(73) Assignee: SK keyfoundry Inc., Cheongju-si (KR)

( * ) Notice: Subject to any disclaimer, the term of this patent is extended or adjusted under 35 U.S.C. 154(b) by 243 days.

(21) Appl. No.: 17/513,948

(22) Filed: Oct. 29, 2021

(65) Prior Publication Data

US 2022/0320333 A1   Oct. 6, 2022

(30) Foreign Application Priority Data

Apr. 5, 2021   (KR) .......................... 10-2021-0044276

(51) Int. Cl.
*H01L 29/78* (2006.01)
*H01L 29/06* (2006.01)
*H01L 29/08* (2006.01)

(52) U.S. Cl.
CPC ........ *H01L 29/7823* (2013.01); *H01L 29/063* (2013.01); *H01L 29/0847* (2013.01)

(58) Field of Classification Search
CPC ............... H01L 29/7823; H01L 29/063; H01L 29/0847; H01L 29/0653; H01L 29/1045; H01L 29/1095; H01L 29/66681; H01L 29/7816

See application file for complete search history.

(56) References Cited

U.S. PATENT DOCUMENTS

| | | | |
|---|---|---|---|
| 5,629,558 A * | 5/1997 | Galbiati | H01L 29/66128 257/E29.328 |
| 2009/0294849 A1 | 12/2009 | Min et al. | |
| 2013/0134526 A1* | 5/2013 | Yoon | H01L 23/544 257/E21.409 |
| 2014/0070311 A1* | 3/2014 | Yang | H01L 29/0878 257/E21.334 |
| 2015/0069508 A1* | 3/2015 | Ko | H01L 29/0615 257/343 |

(Continued)

FOREIGN PATENT DOCUMENTS

| KR | 10-2015-0028607 A | 3/2015 |
|---|---|---|
| KR | 10-2015-0099666 A | 9/2015 |
| KR | 10-2021-0012321 A | 2/2021 |

OTHER PUBLICATIONS

Korean Office Action issued on Jun. 24, 2022, in counterpart Korean Patent Application No. 10-2021-0044276 (7 pages in Korean).

*Primary Examiner* — William B Partridge
*Assistant Examiner* — David Paul Sedorook
(74) *Attorney, Agent, or Firm* — NSIP Law (57) ABSTRACT

A semiconductor device and a manufacturing method thereof are provided. The semiconductor device includes: a first conductive type buried layer disposed on a substrate; a first conductive type deep well region, a second conductive type body region, and a first conductive type drift region which are disposed on the first conductive type buried layer; a source region disposed in the second conductive type body region; a drain region disposed in the first conductive type deep well region; and a gate electrode disposed on the second conductive type body region and the first conductive type drift region.

19 Claims, 9 Drawing Sheets

(56) References Cited

U.S. PATENT DOCUMENTS

| | | | |
|---|---|---|---|
| 2015/0069509 A1* | 3/2015 | Lee | H01L 29/66659 257/343 |
| 2015/0380398 A1* | 12/2015 | Mallikarjunaswamy | H01L 29/7823 257/272 |
| 2017/0263763 A1* | 9/2017 | Ryu | H01L 29/0653 |
| 2019/0245041 A1* | 8/2019 | Chen | H01L 29/7816 |
| 2021/0028307 A1* | 1/2021 | Kim | H01L 29/66681 |
| 2021/0104630 A1* | 4/2021 | Chung | H01L 29/66659 |

* cited by examiner

HIGH VOLTAGE SEMICONDUCTOR DEVICE AND MANUFACTURING METHOD THEREOF

CROSS-REFERENCE TO RELATED APPLICATION(S)

This application claims the benefit under 35 U.S.C. § 119 of Korean Patent Application No. 10-2021-0044276 filed on Apr. 5, 2021, in the Korean Intellectual Property Office, the entire disclosure of which is incorporated herein by reference for all purposes.

BACKGROUND

1. Field

The following description relates to a high voltage semiconductor device and a manufacturing method thereof.

2. Description of Related Art

A Lateral Double-diffused Metal Oxide Semiconductor (LDMOS) transistor, that is, a high voltage power device, may be implemented in various power devices including, but not limited to, display driving integrated circuits (ICs), power converters, motor controllers, and power supplies implemented in vehicles.

The LDMOS may have a low specific on-resistance and a high breakdown voltage. Additionally, in order to improve the switching speed in the DMOS, the capacitance component may be minimized. A reduced surface field (RESURF) structure may reduce the peak electric field within the drain region.

Various types of RESURF structures may increase the withstand voltage while reducing the size of a semiconductor device. A typical RESURF structure semiconductor device optimizes the RESURF structure by including an N-type drift region-P-type buried layer-N-type deep well region. In this structure, the N-type deep well region may be bonded to the N-type buried layer. Accordingly, a high withstand voltage of a small-sized semiconductor device may be implemented.

In order to implement a high voltage LDMOS, a sufficient depletion layer may be needed. To achieve this, a thick P-type epitaxial layer may be formed. When the P-type epitaxial layer disposed between the N-type deep well region and the N-type buried layer becomes thicker, the N-type deep well region may not be bonded to the N-type buried layer, thus affecting the function of the semiconductor device.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

In a general aspect, a semiconductor device includes a first conductive type buried layer disposed on a substrate; a first conductive type deep well region, a second conductive type body region, and a first conductive type drift region which are disposed on the first conductive type buried layer; a source region disposed in the second conductive type body region; a drain region disposed in the first conductive type deep well region; and a gate electrode disposed on the second conductive type body region and the first conductive type drift region, wherein the first conductive type buried layer comprises: a first region disposed on the substrate; and a second region disposed on at least a portion of the first region, and wherein a top surface of the second region is disposed closer to a surface of the substrate than a top surface of the first region.

The second region of the first conductive type buried layer may be in direct contact with the first conductive type deep well region.

A width length of the second region of the first conductive type buried layer in a channel direction may be smaller than a width length of the first conductive type deep well region.

A width length of the second region of the first conductive type buried layer in a channel direction may be greater than a width length of the first conductive type deep well region.

At least a portion of the second region may be disposed to overlap with the first conductive type deep well region.

The semiconductor device may further include a second conductive type buried layer which is disposed on the first conductive type buried layer, wherein the first conductive type drift region may be disposed on the second conductive type buried layer, and wherein a width of the second conductive type buried layer may be equal to a width of the first conductive type drift region.

The semiconductor device may further include a first conductive type well region which is disposed in the first conductive type deep well region, wherein the drain region may be formed in the first conductive type well region.

The semiconductor device may further include a shallow trench isolation region, disposed below the gate electrode; and a deep trench isolation region, disposed adjacent to the drain region.

The deep trench isolation region may be configured to pass through the first conductive type deep well region.

The deep trench isolation region may be configured to pass through the first conductive type deep well region and the second region of the first conductive type buried layer.

A top surface of the first conductive type buried layer may be formed to be more bent than a bottom surface of the first conductive type buried layer.

In a general aspect, a semiconductor device manufacturing method includes providing a substrate; forming a first conductive type buried layer on the substrate; forming a first conductive type deep well region, a second conductive type body region, and a first conductive type drift region on the first conductive type buried layer; forming a gate electrode on the second conductive type body region and the first conductive type drift region; and forming a source region in the second conductive type body region, and forming a gate electrode on the first conductive type deep well region, wherein the forming a first conductive type buried layer comprises: forming a first region by implanting a first conductive type impurity into a top surface of the substrate; and forming a second region by further implanting the first conductive type impurity into the first region, and wherein a top surface of the second region is formed to be higher than a top surface of the first region.

The method may include forming a second conductive type buried layer after the forming of the first conductive type buried layer, wherein the second conductive type buried layer and the first conductive type drift region may be formed with a same mask pattern.

A width of the second conductive type buried layer may be equal to a width of the first conductive type drift region.

The second region may be formed to overlap with the first conductive type deep well region.

The method may further include forming a second conductive type epitaxial layer on the first conductive type buried layer, wherein the first conductive type impurity implanted into the first region is diffused into the second conductive type epitaxial layer to form the second region disposed on a portion of the top surface of the first region.

The second region may be in direct contact with the first conductive type deep well region.

The method may include forming a shallow trench isolation region below the gate electrode; and forming a deep trench isolation region adjacent to the drain region.

A top surface of the first conductive type buried layer may be formed to be more bent than a bottom surface of the first conductive type buried layer.

In a general aspect, a semiconductor device includes a substrate; a first layer, doped with a high concentration N-type impurity, and disposed on the substrate; a second layer, doped with a high concentration P-type impurity, and disposed on the first conductive type buried layer; a conductive type body region, disposed on a side of the second layer; a conductive type drift region, disposed on the second layer; a conductive type deep well region, disposed on a side of the second layer; a shallow trench isolation region, disposed on the conductive type deep well region, and an electrode, disposed on the conductive type body region, the conductive type drift region, and the shallow trench isolation region.

The semiconductor device may further include a source region disposed in the conductive type body region, and a drain region, disposed adjacent to the shallow trench region.

The first layer may include a first region disposed on the substrate and a second region disposed on the first region.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of the application, may be omitted for increased clarity and conciseness.

Throughout the specification, when an element, such as a layer, area, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, areas, layers, or sections, these members, components, areas, layers, or sections are not to be limited by these terms. Rather, these terms are only used to distinguish one member, component, area, layer, or section from another member, component, area, layer, or section. Thus, a first member, component, area, layer, or section referred to in examples described herein may also be referred to as a second member, component, area, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include varies in shape that occur during manufacturing.

Herein, it is noted that use of the term "may" with respect to an example or embodiment, e.g., as to what an example or embodiment may include or implement, means that at least one example or embodiment exists where such a feature is included or implemented while all examples and embodiments are not limited thereto.

The features of the examples described herein may be combined in various ways, as will be apparent after an understanding of the disclosure of this application. Further, although the examples described herein have a variety of configurations, other configurations are possible, as will be apparent after an understanding of the disclosure of this application.

In one or more examples, a semiconductor device that is implemented with a reduced the size and that simultaneously increases the withstand voltage, and a method of manufacturing the same, is provided.

In one or more examples, a semiconductor device may be formed by bonding an N-type deep well region and a first N-type buried layer through the formation of a second N-type buried layer between the N-type deep well region and the first N-type buried layer.

One or more examples relate to a DMOS device and a manufacturing method thereof.

In one or more examples, the semiconductor device, and the manufacturing method of the same, may improve a high breakdown voltage and a high degree of integration while maintaining a high withstand voltage of a high voltage device, without increasing the overall form factor of the device.

Figure 1:
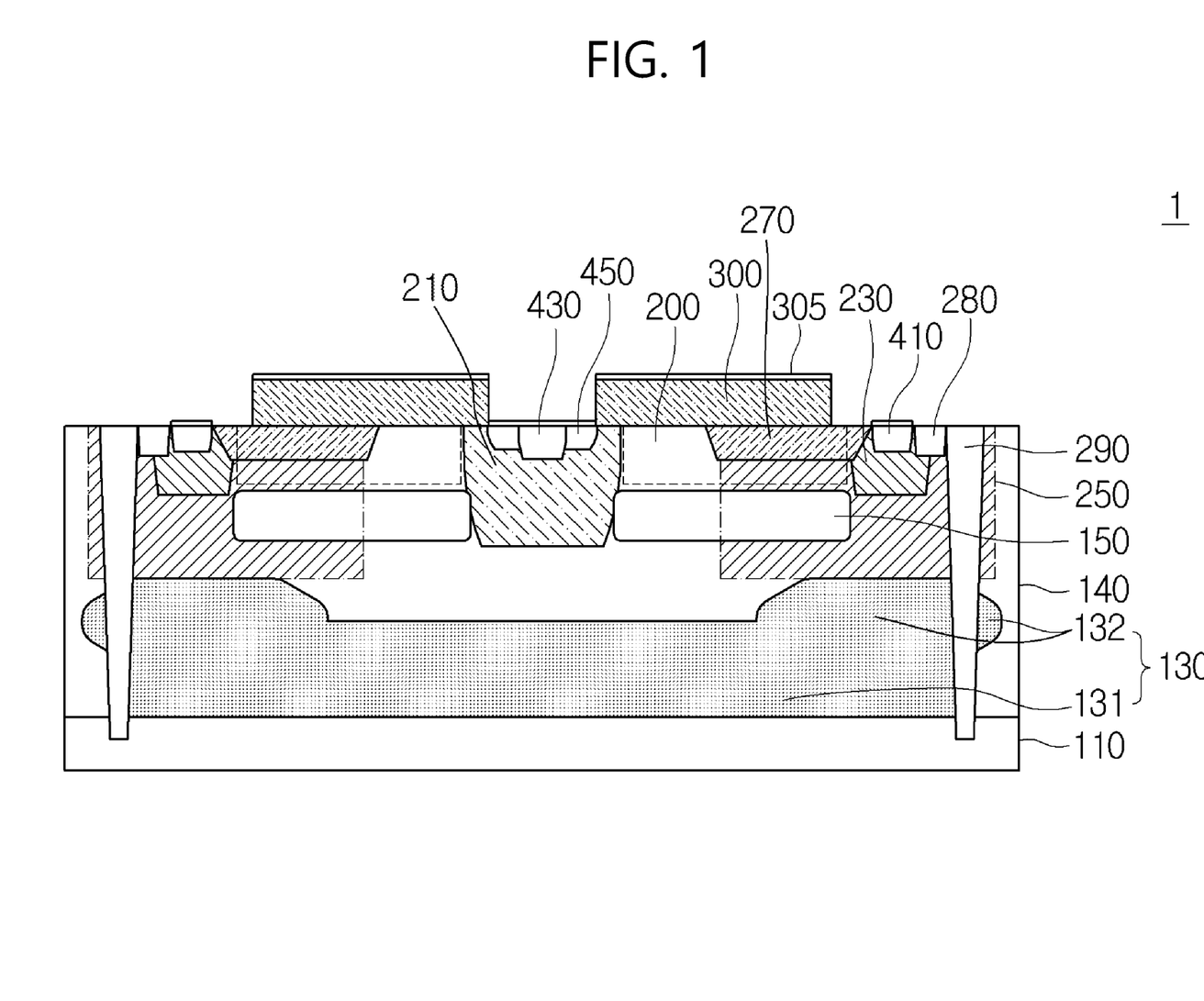
FIG. 1 is an example cross sectional view illustrating an example structure of an example semiconductor device, in accordance with one or more embodiments.

FIG. 1 is an example cross sectional view illustrating an example structure of an example semiconductor device, in accordance with one or more embodiments.

Referring to FIG. 1, an example semiconductor device 1 may include a substrate 110, a first conductive type buried layer 130, a second conductive type epitaxial layer 140, a second conductive type buried layer 150, a first conductive type drift region 200, a second conductive type body region 210, a first conductive type well region 230, a first conductive type deep well region 250, a gate electrode 300, a first conductive type drain region 410, a second conductive type pickup region 430, a first conductive type source region 450.

The substrate 110 may be the epitaxial layer or a silicon substrate. In one or more examples, the substrate 110 may be a P-type silicon substrate. The first conductive type buried layer 130, the second conductive type epitaxial layer 140, and the second conductive type buried layer 150 may be sequentially disposed on the substrate 110. In one or more examples, the first conductive type buried layer 130 may be a layer that is doped with a high concentration N-type impurity. The second conductive type buried layer 150 may be a layer doped with a high concentration P-type impurity. The second conductive type epitaxial layer 140 may be a P-type epitaxial layer.

In one or more examples, since the first conductive type drift region 200 and the second conductive type buried layer 150 may be formed with the same mask pattern, a width of the first conductive type drift region 200 and a width of the second conductive type buried layer 150 may be formed simultaneously. Additionally, both the first conductive type drift region 200 and the second conductive type buried layer 150 may be formed to overlap with the first conductive type deep well region 250.

Further, the first conductive type deep well regions 250 may diffuse to the right and the left, and may be bonded to each other due to diffusion by a thermal process at a high temperature. Thus, the second conductive type epitaxial layer 140, which is present between the first conductive type deep well regions 250, may be changed into the first conductive type deep well region 250.

In one or more examples, the first conductive type buried layer 130 may include a first region 131 formed or disposed on the substrate 110, and a second region 132 formed or disposed on at least a portion of the first region 131. The second region 132 may be formed by doping at least one region of the first region 131 with a first conductive type impurity with a mask pattern. After doping, during a thermal process performed to form components, the first conductive type impurity doped in the first region 131 may be diffused upward to form the second region 132. Thus, a top surface of the second region 132 may be formed closer to a surface of the substrate than a top surface of the first region 131. That is, the top surface of the second region 132 may be formed to be higher than the top surface of the first region 131. Therefore, the second region 132 and the first region 131 may be distinguished from each other. A concentration of the first conductive type impurity in the first region 131 and a concentration of the first conductive type impurity in the second region 132 may be the same as, or different from, each other. In one or more examples, the concentration of the second region 132 may be locally higher than the concentration of the first region 131. In one or more examples, the second region 132 may be formed on the left and right edges of the first region 131.

In the embodiment, the second region 132 may be formed such that at least a portion of the second region 132 overlaps with the below-described first conductive type deep well region 250 in a vertical direction. In one or more examples, a width length of the second region 132 in a channel direction is smaller than a width length of the first conductive type deep well region 250. In one or more examples, the entire second region 132 may overlap with the first conductive type deep well region 250, or a portion of the second region 132 may overlap with the first conductive type deep well region 250. In one or more examples, the second region 132 may vertically overlap with the first conductive type deep well region 250 and a deep trench region 290.

One side (e.g., a lower side) of the second region 132 may contact the first region 131, and a second side (e.g., an upper side) may contact the first conductive type deep well region 250. That is, the first conductive type deep well region 250 may directly contact the first conductive type buried layer 130 through the second region 132. The semiconductor device 1 is able to not only obtain a sufficient depletion layer, but may also reduce the withstand voltage, without increasing the size thereof.

As illustrated in FIG. 1, while a bottom surface of the first conductive type buried layer 130 may be flat or coplanar, a top surface of the first conductive type buried layer 130 may be formed to be bent by the second region 132. This is because the second region 132 may be mainly formed on the top surface of the first region 131. Therefore, the top surface of the first conductive type buried layer 130 may be formed to be more bent than the bottom surface of the first conductive type buried layer 130.

The second conductive type buried layer 150 may be respectively formed on the left side and right side of the second conductive type epitaxial layer 140. Since the second conductive type buried layer 150 may be disposed under the first conductive type drift region 200, this may help to increase the concentration of the first conductive type drift region 200. When the concentration of the first conductive type drift region 200 increases, the resistance of the first conductive type drift region 200 decreases in the state where the semiconductor device 1 is in a turned-on state, and a depletion region may be expanded through the second conductive type buried layer 150 in the state where the semiconductor device 1 is in a turned-off state, so that a desired breakdown voltage may be obtained.

The second conductive type body region 210 may be further formed on the second conductive type epitaxial layer 140. The second conductive type body region 210 may be disposed on one side of the second conductive type buried layer 150. In an example, the second conductive type body region 210 may be a region doped with a P-type impurity having a low concentration. The second conductive type body region 210 may be a region in which a channel region is formed. The concentration of the second conductive type body region 210 may be less than the concentration of the second conductive type buried layer 150. The concentration of the second conductive type buried layer 150 is related to the breakdown voltage, and the concentration of the second conductive type body region 210 is related to a threshold voltage Vt of the device, so that the different concentrations are formed.

The first conductive type deep well region 250, doped with the first conductive type impurity at a lower concentration than a concentration of the first conductive type buried layer 130, may be formed on the second region 132 of the first conductive type buried layer 130. The first conductive type deep well region 250 may be disposed to directly contact the second region 132 of the first conductive type buried layer 130.

A first conductive type well region 230 may be formed in the first conductive type deep well region 250. The first conductive type well region 230 may be doped with the first conductive type impurity at a higher concentration than a concentration of the first conductive type deep well region 250.

On one side of the first conductive type well region 230, a first shallow trench isolation (STI) region 270 may be formed in order to reduce an electric field between the gate electrode 300 and the first conductive type drain region 410. The first STI region 270 may be located just below the gate electrode 300 and may overlap with the gate electrode 300. LOCOS structure may be used, instead of STI.

Additionally, in one or more examples, a second STI region 280 may be additionally formed near, or adjacent to, the drain region 410. In a high voltage or power device, for separation from adjacent devices, a medium trench isolation (MTI) region or a deep trench isolation (DTI) region 290 may be additionally formed on one side of the second STI region 280. In one or more examples, the DTI region 290 may be formed to pass through the first conductive type deep well region 250, the first region 131 and the second region 132 of the first conductive type buried layer 130.

The first conductive type drift region 200 may be disposed on the second conductive type buried layer 150. In an example, the first conductive type drift region 200 may be disposed on both sides of the second conductive type body region 210. In one or more examples, the first conductive type drift region 200 may be a region doped with an N-type impurity. The first conductive type drift region 200 may be formed to reduce a resistance of current path in the semiconductor device 1, increasing a performance of the semiconductor device 1.

The gate electrode 300 may be disposed on the first conductive type drift region 200 and the second conductive type body region 210. In a non-limiting example, the gate electrode 300 may be made of poly-silicon or metal layer.

In one or more examples, a silicide layer 305 may be provided on the gate electrode 300. The silicide layer 305 may be formed on the first conductive type source region 450, the second conductive type pickup region 430, the gate electrode 300, and the first conductive type drain region 410. The silicide layer 305 may be, as non-limiting examples, NiSi, PtSi, CoSi2, or TiSi2.

The first conductive type drain region 410 may be provided in the first conductive type well region 230. In one or more examples, the first conductive type drain region 410 may be a region doped with an N-type impurity having a high concentration.

The first conductive type source region 450 may be provided in the second conductive type body region 210. In an example, the first conductive type source region 450 may be a region doped with an N-type impurity. When a voltage is applied to the first conductive type drain region 410 and the gate electrode 300, a channel region may be formed in the second conductive type body region 210 disposed under the gate electrode 300.

The second conductive type pickup region 430, which is disposed adjacent to the first conductive type source region 450, may be provided in the second conductive type body region 210. In an example, the second conductive type pickup region 430 may be a region doped with a P-type impurity. Additionally, the pickup area 430 may be referred to as a body contact region 430.

Figure 2:
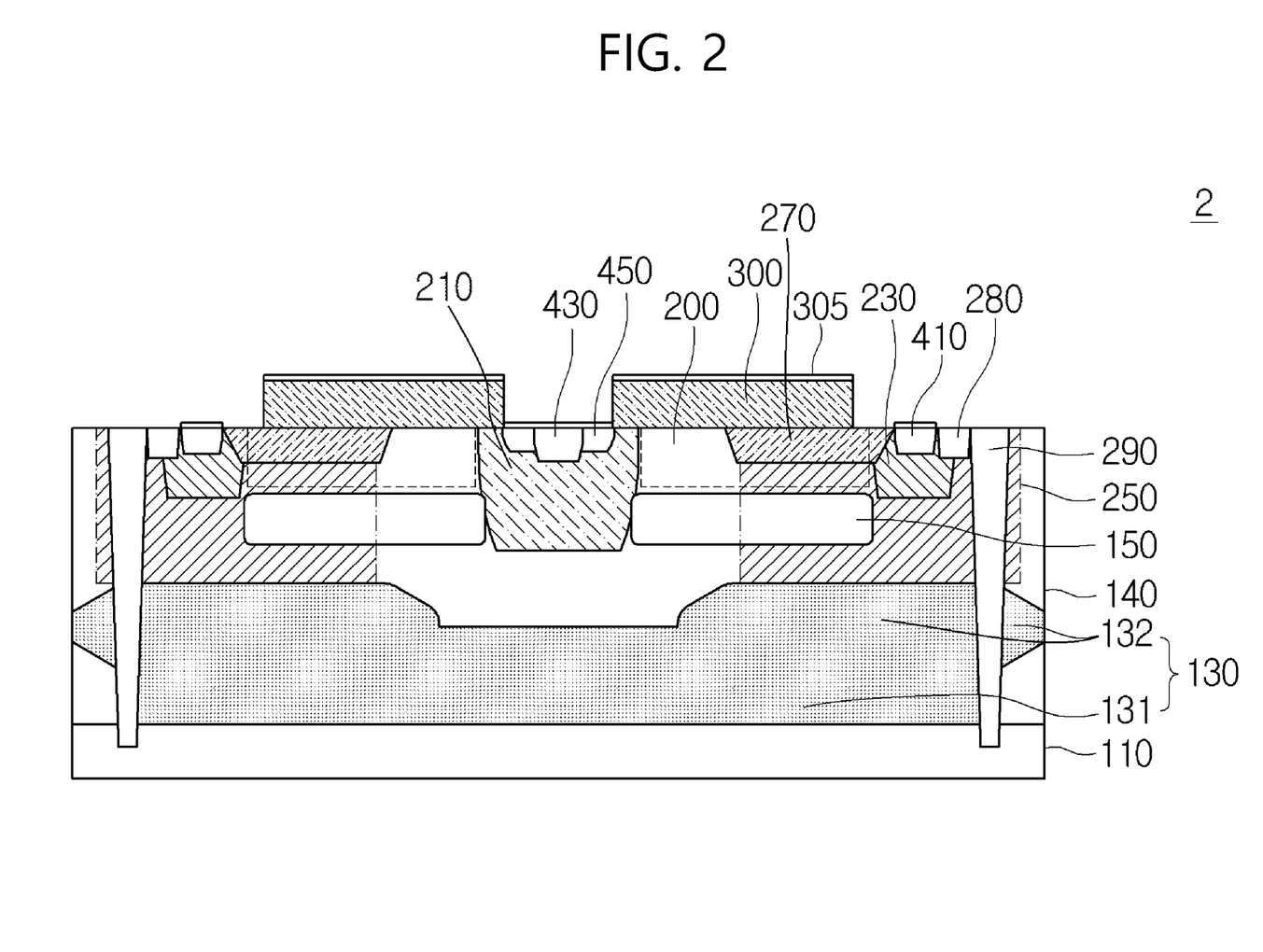
FIG. 2 is an example cross sectional view illustrating an example structure of an example semiconductor device, in accordance with one or more embodiments.

FIG. 2 is an example cross sectional view illustrating an example structure of an example semiconductor device, in accordance with one or more embodiments. Hereinafter, detailed descriptions of components overlapping with the example of FIG. 1 will be omitted.

In the example illustrated in FIG. 2, the first conductive type buried layer 130 of the semiconductor device 2 may include the first region 131 formed on the substrate 110 and the second region 132 formed on at least a portion of the first region 131. In one or more examples, the width length of the second region 132 in the channel direction may be greater than the width length of the first conductive type deep well region 250. In such an example, the entire the second region 132 may overlap with the first conductive type deep well region 250. Additionally, the second region 132 may vertically overlap with the first conductive type deep well region 250 and the deep trench region 290. Additionally, by the second region 132, the top surface of the first conductive type buried layer 130 may be formed to be bent more than the bottom surface of the first conductive type buried layer 130.

Figure 3:
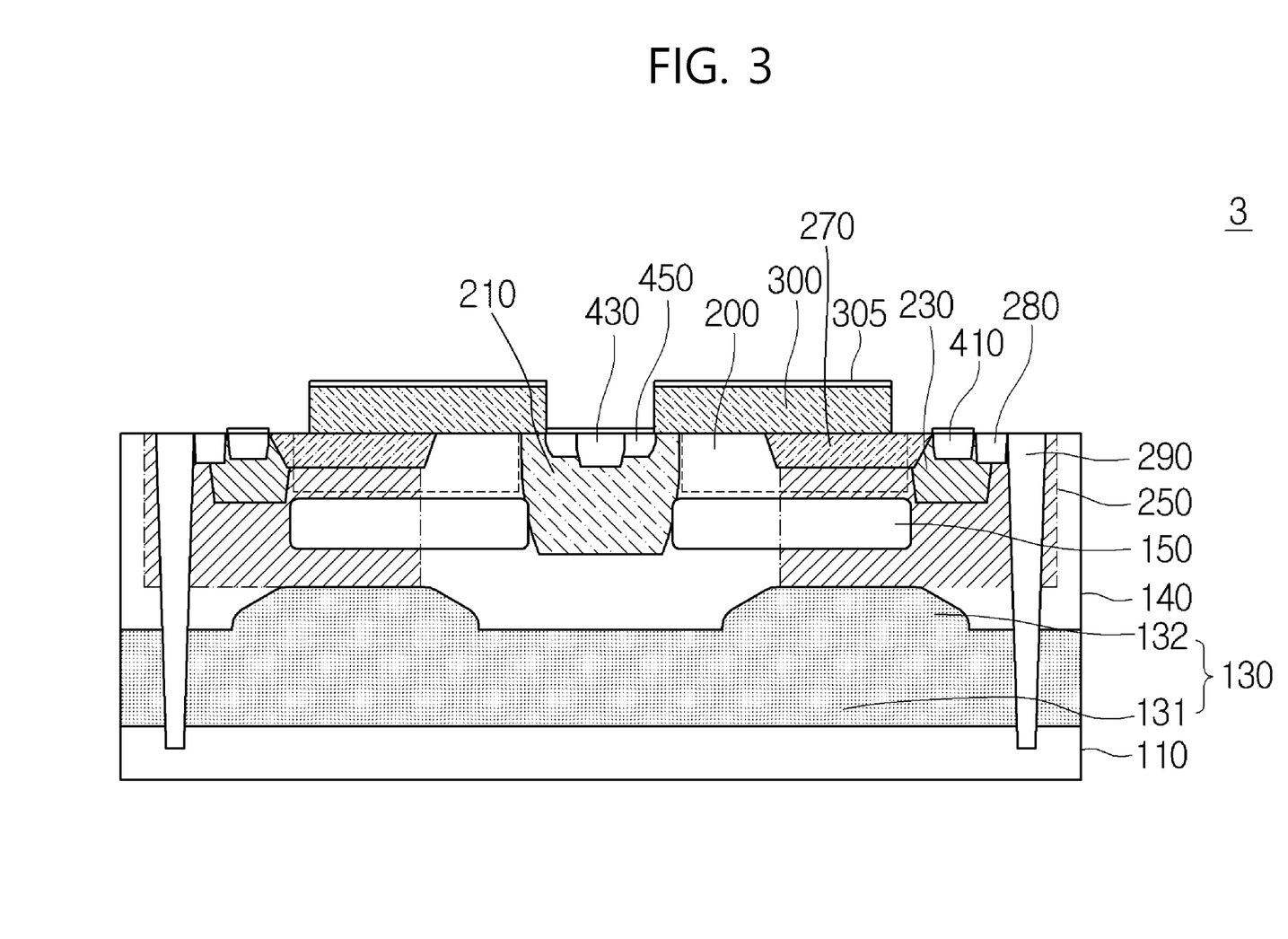
FIG. 3 is an example cross sectional view illustrating an example structure of an example semiconductor device, in accordance with one or more embodiments.

FIG. 3 is an example cross sectional view illustrating an example structure of an example semiconductor device, in accordance with one or more embodiments. Hereinafter, detailed descriptions of components overlapping with the embodiment of FIG. 1 will be omitted.

In an example illustrated in FIG. 3, the first conductive type buried layer 130 of the semiconductor device 3 may include the first region 131 formed on the substrate 110 and the second region 132 formed on at least a portion of the first region 131. In one or more examples, the width length of the second region 132 in the channel direction may be smaller than the width length of the first conductive type deep well region 250. In such an example, a portion of the second region 132 may overlap with the first conductive type deep well region 250. In one or more examples, the second region 132 may vertically overlap with the first conductive type deep well region 250. Additionally, while, in one or more examples, the bottom surface of the first conductive type buried layer 130 may be flat, the top surface may be formed in a convex shape by the second region 132. Therefore, the top surface of the first conductive type buried layer 130 may be formed to be more bent than the bottom surface of the first conductive type buried layer 130.

Unlike the first embodiment, in the third embodiment illustrated in FIG. 3, the second region 132 may not overlap with the deep trench region 290. That is, the deep trench region 290 may be formed to pass through the first conductive type deep well region 250 and the first region 131 of the first conductive type buried layer 130. The second region 132 of the first conductive type buried layer 130 is formed to be spaced apart from the deep trench region 290.

Figure 4:
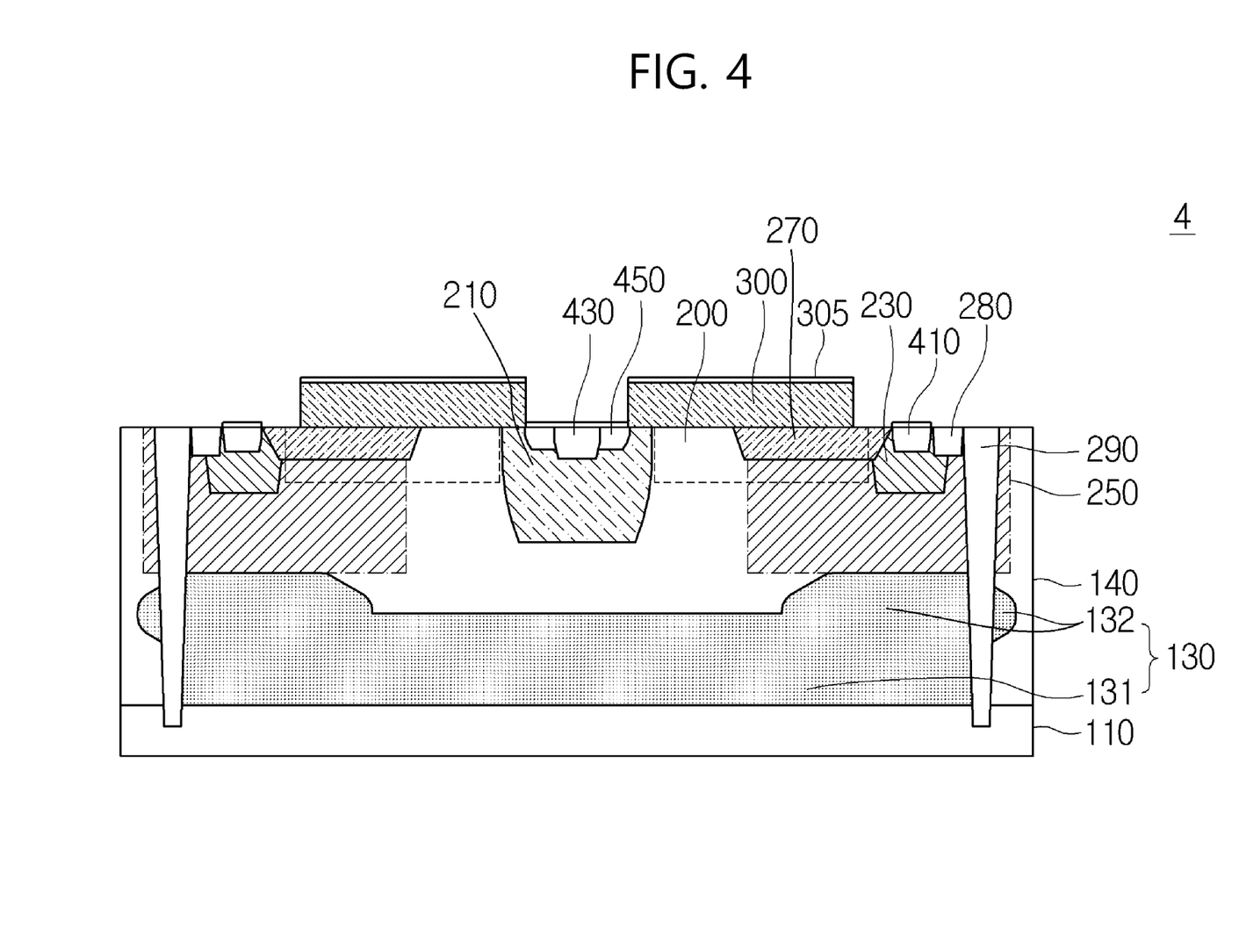
FIG. 4 is an example cross sectional view illustrating an example structure of an example semiconductor device, in accordance with one or more embodiments.

FIG. 4 is an example cross sectional view illustrating an example structure of an example semiconductor device, in accordance with one or more embodiments. Hereinafter, detailed descriptions of components overlapping with the embodiments of FIG. 1 will be omitted.

Compared with the first embodiment, in the fourth embodiment illustrated in FIG. 4, the example semiconductor device 4 may not include the second conductive type buried layer 150. The semiconductor device 4 may not include the second conductive type buried layer 150 when a sufficient withstand voltage can be obtained even without the second conductive type buried layer 150. Therefore, one side (e.g., a lower side) of the second region 132 may contact the first region 131, and a second side (e.g., an upper side) may contact the first conductive type deep well region 250. That is, the first conductive type deep well region 250 may directly contact the first conductive type buried layer 130 through the second region 132.

Figure 5:
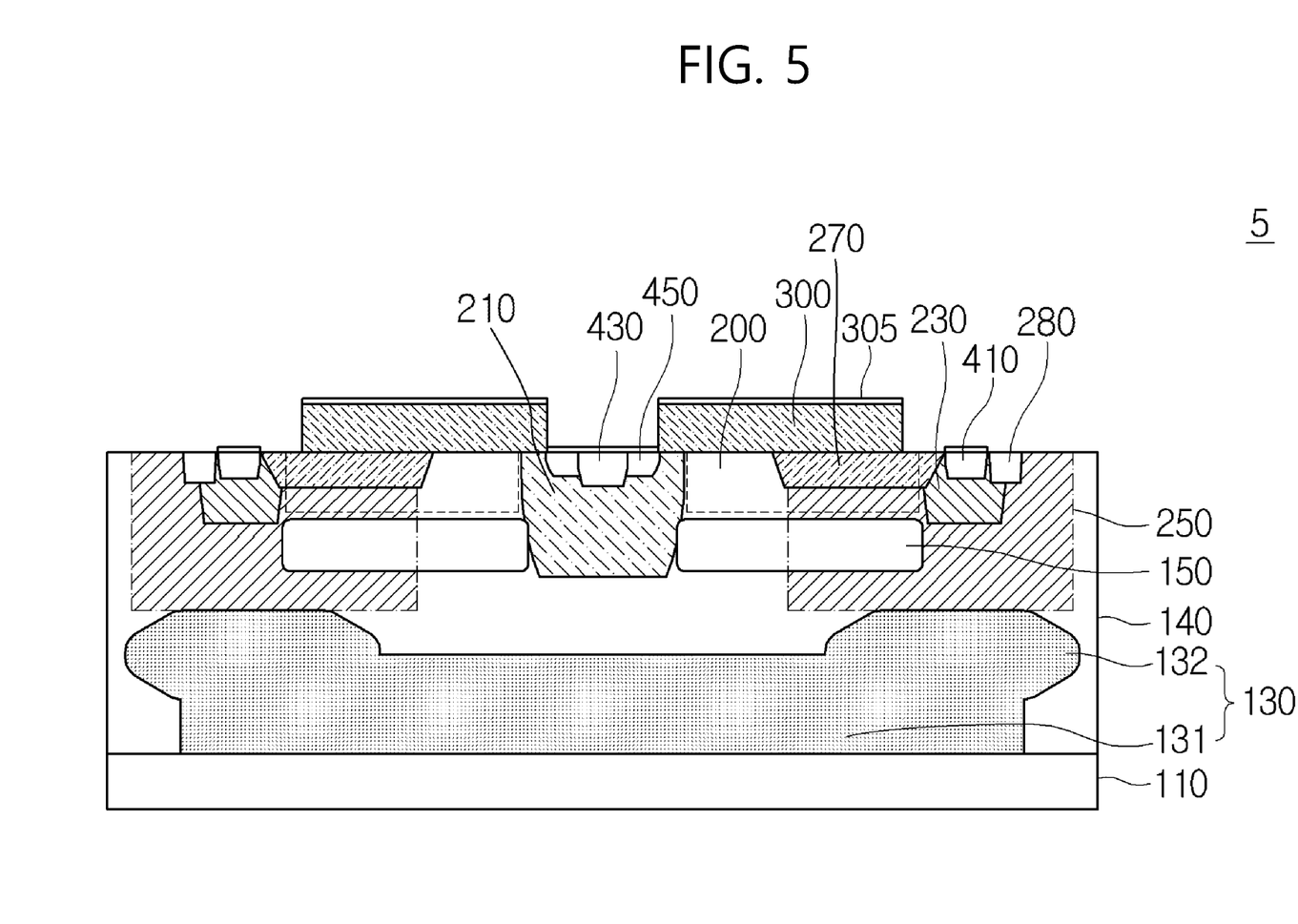
FIG. 5 is an example cross sectional view illustrating an example structure of an example semiconductor device, in accordance with one or more embodiments.

FIG. 5 is an example cross sectional view illustrating an example structure of an example semiconductor device, in accordance with one or more embodiments. Hereinafter, detailed descriptions of components overlapping with the embodiments of FIG. 1 will be omitted.

Compared with the first embodiment, in the fifth embodiment illustrated in FIG. 5, the example semiconductor device 5 may not include the deep trench region 290. Instead, a device isolation region may be formed by junction isolation or self-isolation (not shown).

In one or more examples, the first conductive type buried layer 130 may include the first region 131 formed on the substrate 110 and the second region 132 formed on at least a portion of the first region 131. One side (e.g., a lower side) of the second region 132 may contact the first region 131, and a second side (e.g., an upper side) may contact the first conductive type deep well region 250. That is, the first conductive type deep well region 250 may directly contact the first conductive type buried layer 130 through the second region 132. Further, the semiconductor device 5 which uses junction separation or self-isolation.

Figure 6A:
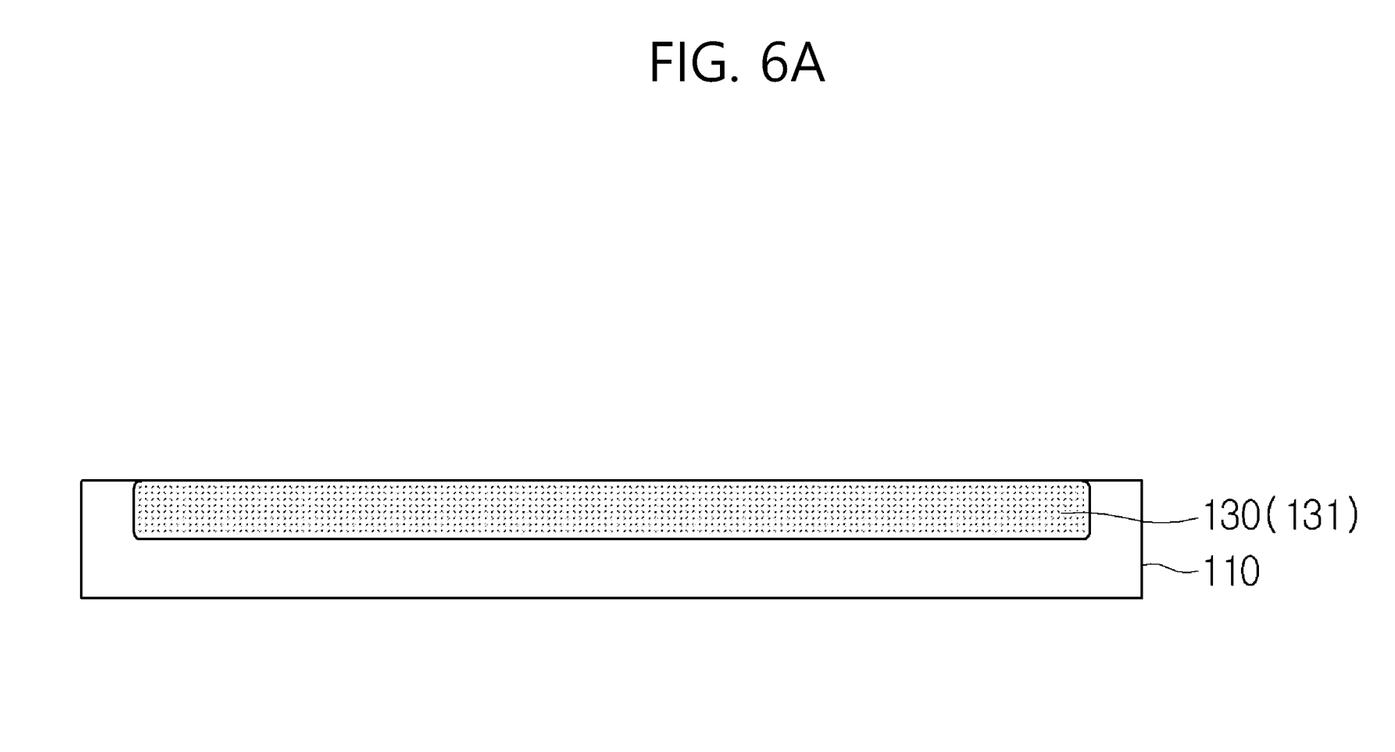
FIGS. 6A-6D are example process cross sectional views illustrating an example semiconductor device manufacturing method, in accordance with one or more embodiments.

FIGS. 6A to 6D illustrate example process cross sectional views of a semiconductor device manufacturing method, in accordance with one or more embodiments Referring to FIG. 6A, the first conductive type buried layer 130 may be formed on the substrate 110. The first region 131 of the first conductive type buried layer 130 may be formed by implanting an N-type impurity into the top surface of the substrate 110.

Figure 6B:
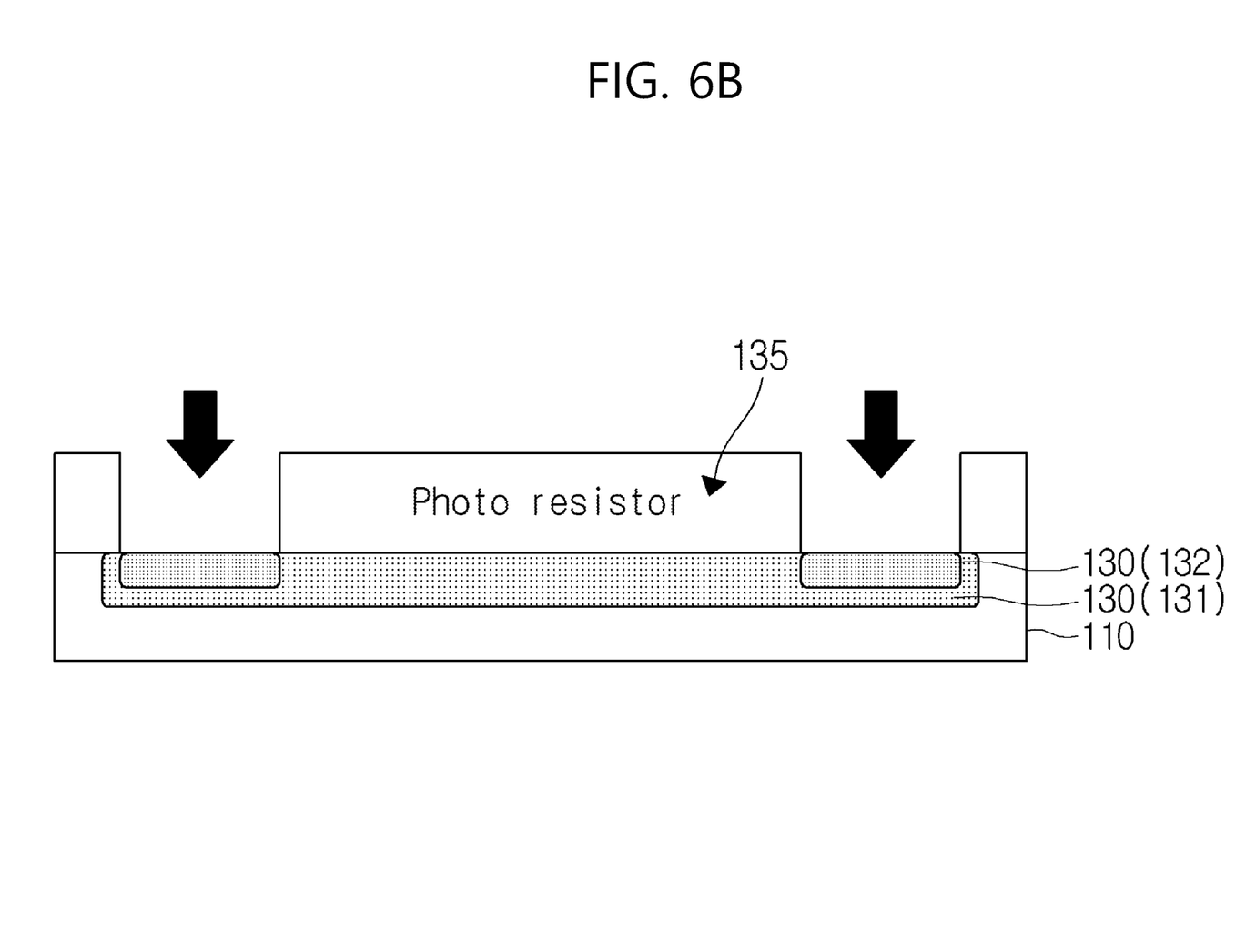

Referring to FIG. 6B, a photo resistor may be applied to a portion of the top surface of the first region 131 of the first conductive type buried layer 130, so that the remaining top surface of the first region 131 is exposed upward. Additionally, the second region 132 may be formed by implantation the first conductive type impurities to the exposed top surface of the first region 131. In an example, the second region 132 may be formed on the left and right edges of the first region 131. The second region 132 may be formed such that at least one region of the second region 132 overlaps in a vertical direction with the first conductive type deep well region 250 to be formed later. The width length of the second region 132 in the channel direction may be formed to be shorter or longer than the width length of the first conductive type deep well region 250.

In one or more examples, after removing the photo resistor, in order to remove defects due to the impurity implantation in the first conductive type buried layer 130 before forming the second conductive type epitaxial layer 140, a high temperature annealing process may be performed. In a non-limiting example, the annealing process may be performed at 600 to 1200° C. The running time of the annealing process can be appropriately selected such that the defect can be sufficiently removed.

In one or more examples, after removing the photo resistor, a cleaning process that removes remaining oxide on the first conductive type buried layer 130 may be further performed. In an example, oxide may be removed by using a diluted HF solution and may be removed through a typical cleaning process.

Figure 6C:
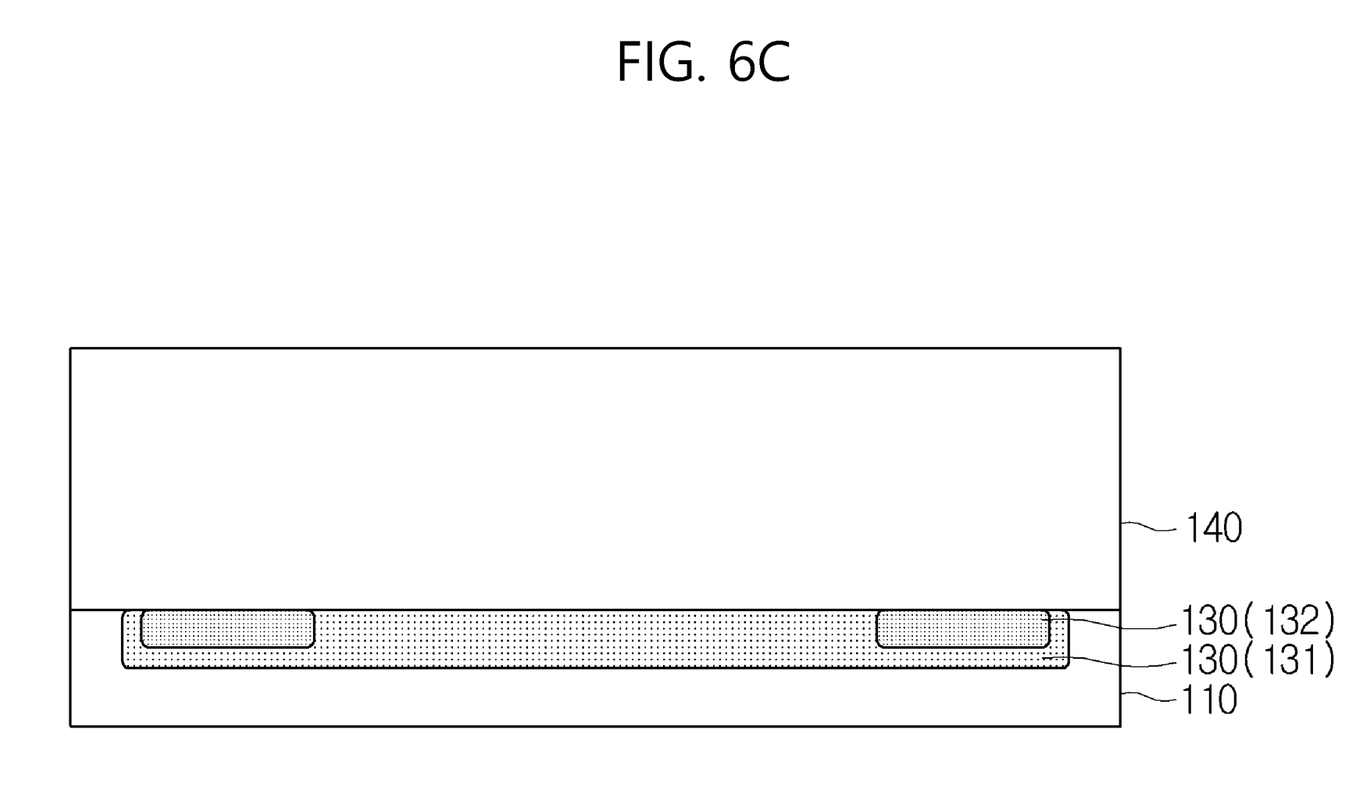

Referring to FIG. 6C, after the photo resistor is removed, the second conductive type epitaxial layer 140 may be formed on the first conductive type buried layer 130. The second conductive type epitaxial layer 140 is grown using silane (SiH4) gas at high temperature with in-situ doping process.

Figure 6D:
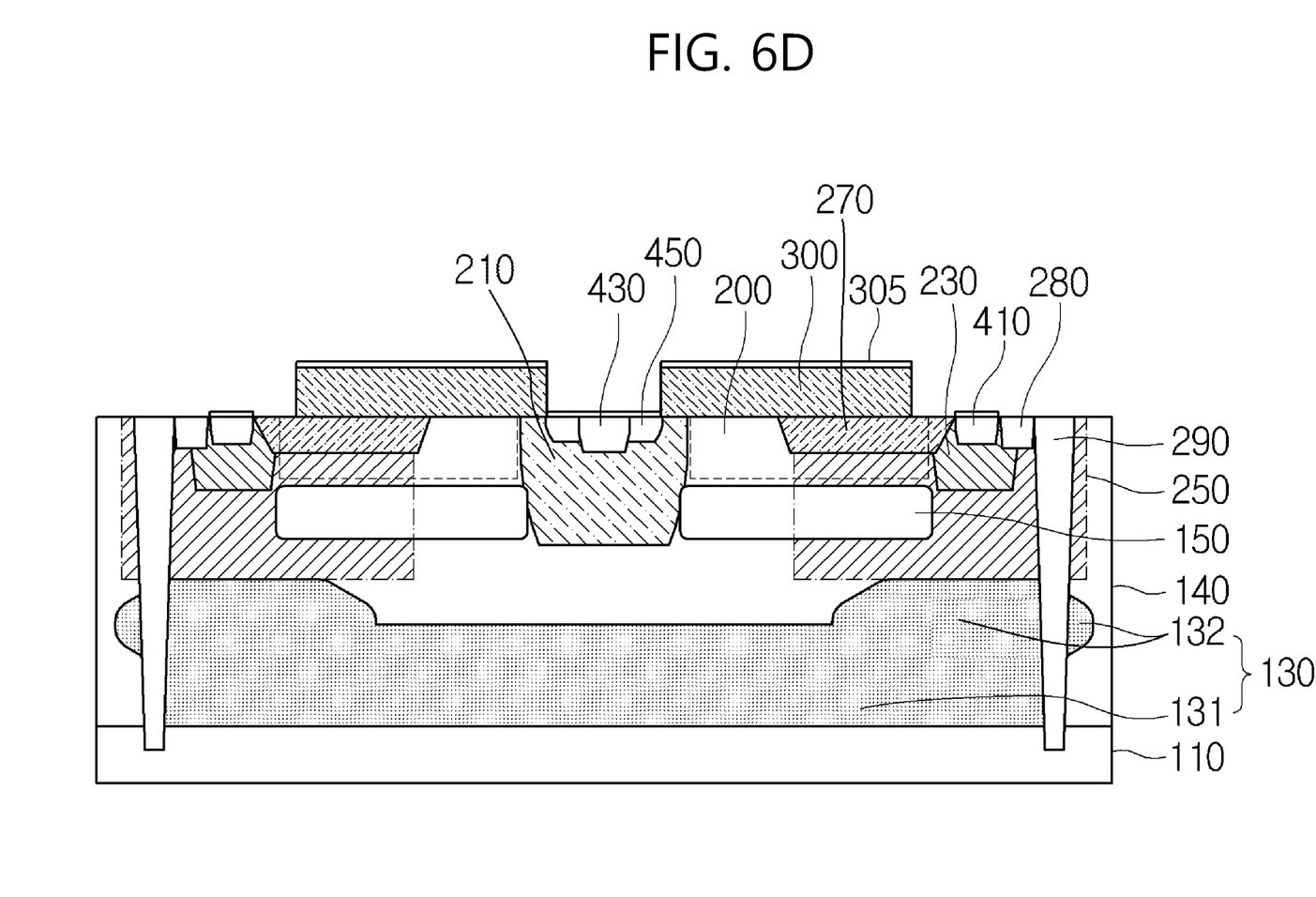

Referring to FIG. 6D, the first conductive type deep well region 250 may be formed in the second conductive type epitaxial layer 140. The first conductive type deep well region 250 may be formed on the second region 132 of the first conductive type buried layer 130. In an example, the first conductive type deep well region 250 may be formed by implanting an N-type impurity.

Then, a P-type impurity may be implanted into the second conductive type epitaxial layer 140 by using a mask pattern to form a second conductive type buried layer 150. A first conductive type drift region 200 may be formed on the second conductive type buried layer 150 using the same mask pattern for forming the second conductive type buried layer 150. The first conductive type drift region 200 may be formed by implanting an N-type impurity into an active region formed on the second conductive type buried layer 150. Since the same mask pattern is used, the width of the first conductive type drift region 200 and the width of the second conductive type buried layer 150 may be formed to be similar to, or substantially the same as, each other. Additionally, both the first conductive type drift region 200 and the second conductive type buried layer 150 may be formed to partially overlap with the first conductive type deep well region 250.

Additionally, the second conductive type body region 210 may be formed on the second conductive type buried layer 150. The second conductive type body region 210 may be formed by implanting a P-type impurity into the active region. In one or more examples, the second conductive type body region 210 may be doped with a low concentration P-type impurity.

Then, first conductive type well region 230 may be formed by implanting a high concentration N-type impurity into the first conductive type deep well region 250. Additionally, the first conductive type drain region 410 may be formed in the first conductive type well region 230, and the first conductive type source region 450 and the second conductive type pickup region 430 may be formed in the second conductive type body region 210. The first conductive type drain region 410 and the source region 450 may be formed by implanting an N-type impurity, and the second conductive type pickup region 430 may be formed by implanting a P-type impurity. The second conductive type pickup region 430 may be doped with a P-type impurity at a higher concentration than a concentration of the second conductive type body region 210. In one or more examples, the shallow trench isolation regions 270 and 280 and/or the deep trench regions 290 may be formed in the first conductive type deep well region 250. The deep trench region 290 may be formed in the vicinity of the drain region 410.

Then, the gate electrode 300 may be formed on the second conductive type body region 210 and the first conductive type drift region 200. For separation from the substrate, a gate insulation layer (not shown) may be formed in advance under the gate electrode 300. Also, the silicide layer 305 is formed on the first conductive type source region 450, the second conductive type pickup region 430, the gate electrode 300, and the first conductive type drain region 410.

During the subsequent process described above, the impurity implanted into the second region 132 of the first conductive type buried layer 130 may be diffused into the second conductive type epitaxial layer 140. Accordingly, the second region 132 may be formed on at least a portion of the first region 131. The impurity may diffuse to the first conductive type deep well region 250. Then, the first conductive type deep well region 250 and the second region 132 of the first conductive type buried layer 130 may directly contact each other.

While this disclosure includes examples, it will be apparent after an understanding of the disclosure of this application that various varies in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device, comprising:
   a first conductive type buried layer disposed on a substrate;
   a first conductive type deep well region, a second conductive type body region, and a first conductive type drift region which are disposed on the first conductive type buried layer, wherein the first conductive type buried layer has a doping concentration greater than that of the first conductive type deep well region;
   a source region disposed in the second conductive type body region;
   a drain region disposed in the first conductive type deep well region;
   a gate electrode disposed on the second conductive type body region and the first conductive type drift region;
   a shallow trench isolation region disposed below the gate electrode; and
   a deep trench isolation region disposed adjacent to the drain region,
   wherein the source region is disposed between two adjacent gate electrodes and spaced apart from the deep trench isolation region,
   wherein the first conductive type buried layer comprises:
      a first region disposed on the substrate; and
      a second region disposed on either edge of the first region, and
   wherein a top surface of the second region is formed higher than a top surface of the first region with respect to a bottom surface of the first conductive type buried layer.

2. The semiconductor device of claim 1, wherein the second region of the first conductive type buried layer is in direct contact with the first conductive type deep well region.

3. The semiconductor device of claim 1, wherein a width length of the second region of the first conductive type buried layer in a channel direction is smaller than a width length of the first conductive type deep well region.

4. The semiconductor device of claim 1, wherein a width length of the second region of the first conductive type buried layer in a channel direction is greater than a width length of the first conductive type deep well region.

5. The semiconductor device of claim 1, wherein at least a portion of the second region is disposed to overlap with the first conductive type deep well region.

6. The semiconductor device of claim 1, further comprising:
   a second conductive type buried layer comprising a first buried layer and a second buried layer spaced apart from each other and disposed on the first conductive type buried layer,
   wherein the second conductive type body region is disposed between the first buried layer and the second buried layer.

7. The semiconductor device of claim 1, further comprising a first conductive type well region which is disposed in the first conductive type deep well region,
   wherein the drain region is formed in the first conductive type well region.

8. The semiconductor device of claim 1, wherein the deep trench isolation region is configured to pass through the first conductive type deep well region.

9. The semiconductor device of claim 1, wherein the deep trench isolation region is configured to pass through the first conductive type deep well region and the second region of the first conductive type buried layer.

10. The semiconductor device of claim 1, wherein a top surface of the first conductive type buried layer is formed to be more bent than a bottom surface of the first conductive type buried layer.

11. A semiconductor device manufacturing method, the method comprising:
   providing a substrate;
   forming a shallow trench isolation region in the substrate;
   forming a first conductive type buried layer in the substrate;
   forming a first conductive type deep well region, a second conductive type body region, and a first conductive type drift region on the first conductive type buried layer, wherein the first conductive type buried layer has a doping concentration greater than that of the first conductive type deep well region;
   forming a gate electrode on the second conductive type body region and the first conductive type drift region;
   forming a source region in the second conductive type body region;

forming a drain region on the first conductive type deep well region; and forming a deep trench isolation region adjacent to the drain region, wherein the source region is formed between two adjacent gate electrodes and spaced apart from the deep trench isolation region, wherein the forming a first conductive type buried layer comprises:

forming a first region by implanting a first conductive type impurity into a top surface of the substrate; and forming a second region on either edge of the first region by further implanting the first conductive type impurity into the first region, wherein a top surface of the second region is formed higher than a top surface of the first region with respect to a bottom surface of the first conductive type buried layer, and wherein the second region overlaps vertically with the first conductive type deep well region.

12. The method of claim 11, further comprising:

forming a second conductive type buried layer comprising a first buried layer and a second buried layer spaced apart from each other after the forming of the first conductive type buried layer, wherein the second conductive type body region is disposed between the first buried layer and the second buried layer.

13. The method of claim 12, wherein a width of the second conductive type buried layer is equal to a width of the first conductive type drift region.

14. The method of claim 11, further comprising forming a second conductive type epitaxial layer on the first conductive type buried layer, wherein the first conductive type impurity implanted into the first region is diffused into the second conductive type epitaxial layer to form the second region disposed on a portion of the top surface of the first region.

15. The method for manufacturing a semiconductor device of claim 11, wherein the second region is in direct contact with the first conductive type deep well region.

16. The method of claim 11, wherein a top surface of the first conductive type buried layer is formed to be more bent than a bottom surface of the first conductive type buried layer.

17. A semiconductor device, comprising:
   a substrate;
   a first layer doped with a high concentration N-type impurity and disposed on the substrate;
   a second layer doped with a high concentration P-type impurity and disposed on the first layer;
   a third layer doped with the high concentration P-type impurity and disposed on the first layer;
   a conductive type body region disposed on a side of the second layer, wherein each of the second layer and the third layer is in direct contact with the conductive type body region;
   a conductive type drift region disposed on the second layer;
   a conductive type deep well region disposed on the first layer;
   a shallow trench isolation region disposed on the conductive type deep well region;
   a gate electrode arranged to overlap the conductive type body region, the conductive type drift region, and the shallow trench isolation region;
   a drain region disposed adjacent to the shallow trench region;
   a source region disposed between two adjacent gate electrodes; and
   a deep trench isolation region disposed adjacent to the drain region,
   wherein the source region is spaced apart from the deep trench isolation region.

18. The semiconductor device of claim 17,
   wherein the first layer comprises a first region disposed on the substrate and a second region disposed on the first region, and
   wherein a plane of a top surface of the second region is different from a plane of a top surface of the first region.

19. The semiconductor device of claim 17, wherein regions of a top surface of the first layer have different planes.

* * * * *